(12) United States Patent
Chih et al.

(10) Patent No.: US 10,643,726 B2
(45) Date of Patent: *May 5, 2020

(54) MEMORY DEVICE WITH A FUSE PROTECTION CIRCUIT

(71) Applicant: Taiwan Semiconductor Manufacturing Company Limited, Hsinchu (TW)

(72) Inventors: Yu-Der Chih, Hsinchu (TW); Chen-Ming Hung, Hsinchu County (TW); Jen-Chou Tseng, Hsinchu County (TW); Jam-Wem Lee, Hsinchu (TW); Ming-Hsiang Song, Hsinchu (TW); Shu-Chuan Lee, Hsinchu (TW); Shao-yu Chou, Hsinchu (TW); Yu-Ti Su, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/392,741

(22) Filed: Apr. 24, 2019

(65) Prior Publication Data
US 2019/0252032 A1 Aug. 15, 2019

Related U.S. Application Data

(63) Continuation of application No. 16/133,783, filed on Sep. 18, 2018, now Pat. No. 10,283,210, which is a
(Continued)

(51) Int. Cl.
*G11C 17/00* (2006.01)
*G11C 17/18* (2006.01)
(Continued)

(52) U.S. Cl.
CPC ............ *G11C 17/18* (2013.01); *G11C 7/24* (2013.01); *G11C 17/16* (2013.01); *H01L 27/0251* (2013.01)

(58) Field of Classification Search
CPC .......... G11C 17/18; G11C 7/24; G11C 17/16; H01L 27/0251
(Continued)

(56) References Cited

U.S. PATENT DOCUMENTS 5,706,238 A 1/1998 Cutter et al.
6,574,159 B2 6/2003 Ohbayashi et al.
(Continued)

FOREIGN PATENT DOCUMENTS

EP 2195811 5/2012

OTHER PUBLICATIONS

Taiwan Office Action; Application No. 106119577; dated Mar. 4, 2020.

*Primary Examiner* — Huan Hoang
(74) *Attorney, Agent, or Firm* — Jones Day

(57) ABSTRACT

A memory device includes a memory circuit and a fuse protection circuit. The memory circuit includes a memory cell and a program line. The memory cell includes a fuse. The program line is configured to receive a program voltage for programming the fuse. The fuse protection circuit is coupled to the memory circuit and is configured to prevent unintentional programming of the fuse.

20 Claims, 17 Drawing Sheets

Related U.S. Application Data continuation of application No. 15/493,964, filed on Apr. 21, 2017, now Pat. No. 10,109,366.

(60) Provisional application No. 62/433,279, filed on Dec. 13, 2016.

(51) Int. Cl.
*G11C 17/16* (2006.01)
*H01L 27/02* (2006.01)
*G11C 7/24* (2006.01)

(58) Field of Classification Search
USPC .......................................................... 365/96
See application file for complete search history.

(56) References Cited

U.S. PATENT DOCUMENTS

| | | |
|---|---|---|
| 7,136,322 B2 | 11/2006 | Brennan et al. |
| 10,109,366 B2 | 10/2018 | Chih et al. |
| 10,283,210 B2 * | 5/2019 | Chih .................. G11C 7/24 |
| 2007/0285854 A1 | 12/2007 | Rodgers et al. |

\* cited by examiner

MEMORY DEVICE WITH A FUSE PROTECTION CIRCUIT

CROSS-REFERENCE TO RELATED APPLICATION

This application is a continuation of U.S. patent application Ser. No. 16/133,783, filed Sep. 18, 2018, which claims priority to U.S. patent application Ser. No. 15/493,964, filed Apr. 21, 2017, which claims priority to U.S. Provisional Patent Application No. 62/433,279, filed Dec. 13, 2016, both of which are incorporated herein by reference in their entirety.

BACKGROUND

A memory device includes a memory cell operable so as to store a bit, i.e., '0' or '1', of data therein. The memory cell includes a fuse. When the fuse is blown or programmed, a bit, e.g., '1', is stored in the memory cell. Otherwise, i.e., when the fuse is left intact or unprogrammed, a bit, e.g., '0', is stored.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
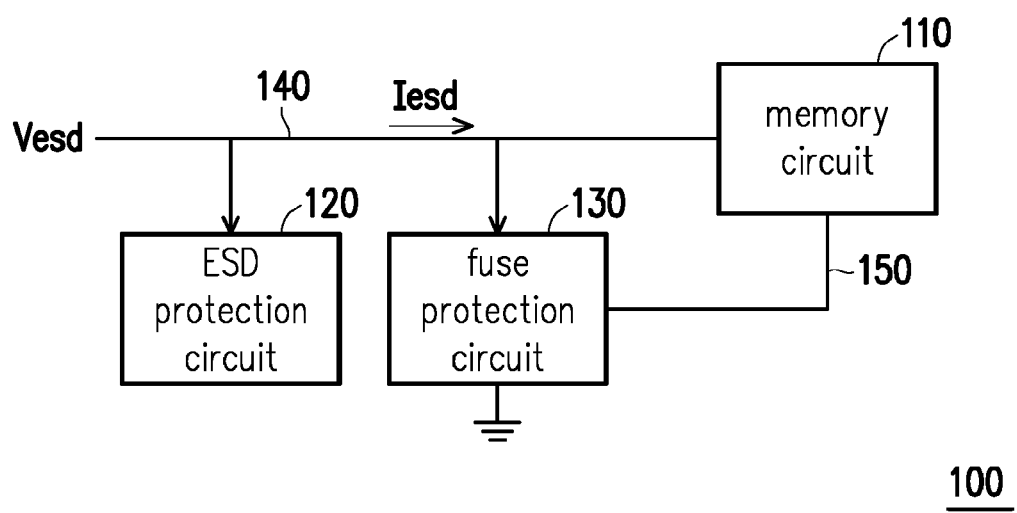
FIG. 1 is a schematic diagram illustrating the first exemplary memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A read-only memory (ROM) device is a type of a non-volatile memory that, contrary to a volatile memory, does not require a supply voltage to retain data stored therein. FIG. 1 is a schematic diagram illustrating the first exemplary memory device 100 in accordance with some embodiments. The example memory device 100 is a ROM device and includes a memory circuit 110, an electro-static discharge (ESD) protection circuit 120, and a fuse protection circuit 130.

The memory circuit 110 includes memory cells each configured to store a bit, '0' or '1', of data therein using a fuse. For example, when a fuse of the memory cell is blown/programmed, a bit '1' is stored in the memory cell. Otherwise, i.e., when the fuse is left intact/unprogrammed, a bit '0' is stored. The fuse is susceptible to unintentional programming. This risk is mitigated in certain embodiments herein. In the example of FIG. 1, the ESD protection circuit 120 is connected to the memory circuit 110 through a line 140, e.g., a first program line (PL1) in FIG. 2, of the memory circuit 110 and is configured to protect components of the memory circuit 110 from damages that may incur by an ESD. In particular, when the line 140 is subjected to an ESD, the ESD protection circuit 120 reduces an ESD voltage associated with the ESD to a reduced ESD voltage (Vesd). The reduced ESD voltage (Vesd) has an amount that is less an amount of the ESD voltage and that is tolerable by the components of the memory circuit 110. But, despite this ESD protection circuit 120 mitigation, a reduced ESD current (Iesd) associated with the reduced ESD voltage (Vesd) may still flow through. Such a current (Iesd) may be sufficient to unintentionally program the fuse.

As will be described in detail below, the fuse protection circuit 130 is configured to prevent such an unintentional programming of the fuse. In an exemplary embodiment, the fuse protection circuit 130 is connected between the line 140 and another line 150, e.g., a second program line (PL2) in FIG. 2, of the memory circuit 110. When the aforementioned reduced ESD current (Iesd) flows through the line 140, the fuse protection circuit 130 connects the line 150 to a ground, discharging the ESD current (Iesd) to the ground that may otherwise flow through and program the fuse.

Figure 2:
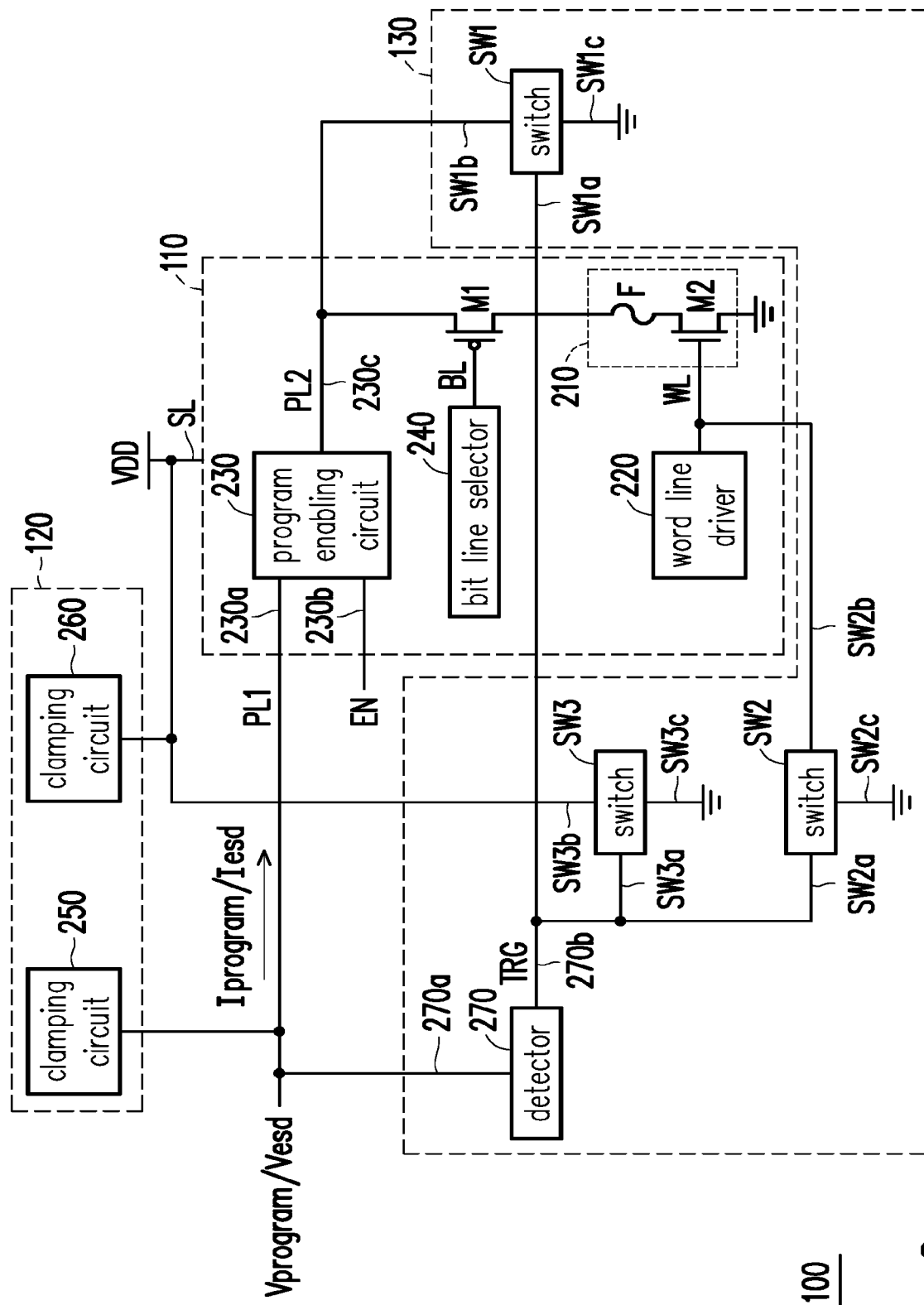
FIG. 2 is a schematic diagram illustrating an exemplary memory circuit, an exemplary ESD protection circuit, and an exemplary fuse protection circuit in accordance with some embodiments.

FIG. 2 is a schematic diagram illustrating an exemplary memory circuit 110, an exemplary ESD protection circuit 120, and an exemplary fuse protection circuit 130 in accordance with some embodiments. The memory circuit 110 includes a supply line (SL), a memory cell 210, a pass gate transistor (M1), a word line driver 220, a word line (WL), a first program line (PL1), a program enabling circuit 230, a bit line (BL), a bit line selector 240, and a second program line (PL2).

The supply line (SL) is configured to receive a supply voltage, e.g., VDD. The memory cell 210 includes an access transistor (M2) connected to the ground and a fuse (F) connected between the pass gate transistor (M1) and the access transistor (M2). The word line driver 220 is connected to the access transistor (M2) through the word line (WL). The bit line selector 240 is connected to the pass gate transistor (M1) through the bit line (BL). The pass gate transistor (M1) is connected to an output terminal 230c of the program enabling circuit 230 through the second program line (PL2). The program enabling circuit 230 has a first input terminal 230a connected to the first program line (PL1) and a second input terminal 230b configured to receive an enable signal (EN). The program enabling circuit 230 is operable so as to allow and inhibit programming of the fuse (F) in response to the enable signal (EN). For example, when a level of the enable signal (EN) is high, the program enabling circuit 230 connects the second program line (PL2) to the first program line (PL1) to thereby allow programming of the fuse (F). Otherwise, i.e., when the level of the enable signal (EN) is low, the program enabling circuit 230 disconnects the second program line (PL2) from the first program line (PL1), inhibiting programming of the fuse (F). In one embodiment, simultaneous with the inhibition of programming the fuse (F), the program enabling circuit 230 connects the second program line (PL2) to the ground. As described below, this discharges the aforementioned reduced ESD current (Iesd).

The ESD protection circuit 120 includes clamping circuits 250, 260 connected to the first program line (PL1) and the supply line (SL), respectively. The ESD protection circuit 120 is configured to detect presence of an ESD event at the first program line (PL1) and the supply line (SL) and to clamp/reduce an ESD voltage, e.g., about 2000V, associated with the ESD event to a reduced ESD voltage (Vesd), e.g., 2V. This causes a reduced ESD current (Iesd) associated with the reduced ESD voltage (Vesd) to flow through the first program line (PL1). It is noted that, without the fuse protection circuit 130, the reduced ESD current (Iesd) may further flow through and unintentionally program the fuse (F).

The fuse protection circuit 130 includes a detector 270 and switches (SW1, SW2, SW3). The detector 270 is configured to detect the reduced ESD current (Iesd). The switches (SW1, SW2, SW3) are controlled by the detector 270 to respectively connect the second program line (PL2), the word line (WL), and the supply line (SL) to the ground upon detection by the detector 270 of the reduced ESD current (Iesd). In further detail, the detector 270 has an input terminal 270a connected to the first program line (PL1). The switch (SW1) has a first switch terminal (SW1a) connected to an output terminal 270b of the detector 270, a second switch terminal (SW1b) connected to the second program line (PL2), and a third switch terminal (SW1c) connected to the ground. The switch (SW2) has a first switch terminal (SW2a) connected to the output terminal 270b of the detector 270, a second switch terminal (SW2b) connected to the word line (WL), and a third switch terminal (SW2c) connected to the ground. The switch (SW3) has a first switch terminal (SW3a) connected to the output terminal 270b of the detector 270, a second switch terminal (SW3b) connected to the supply line (SL), and a third switch terminal (SW3c) connected to the ground. In some embodiments, one of the switches (SW1, SW2, SW3) is an n-type field-effect transistor (FET). In other embodiments, one of the switches (SW1, SW2, SW3) is a ptype FET or any sort of transistor.

Figure 3:
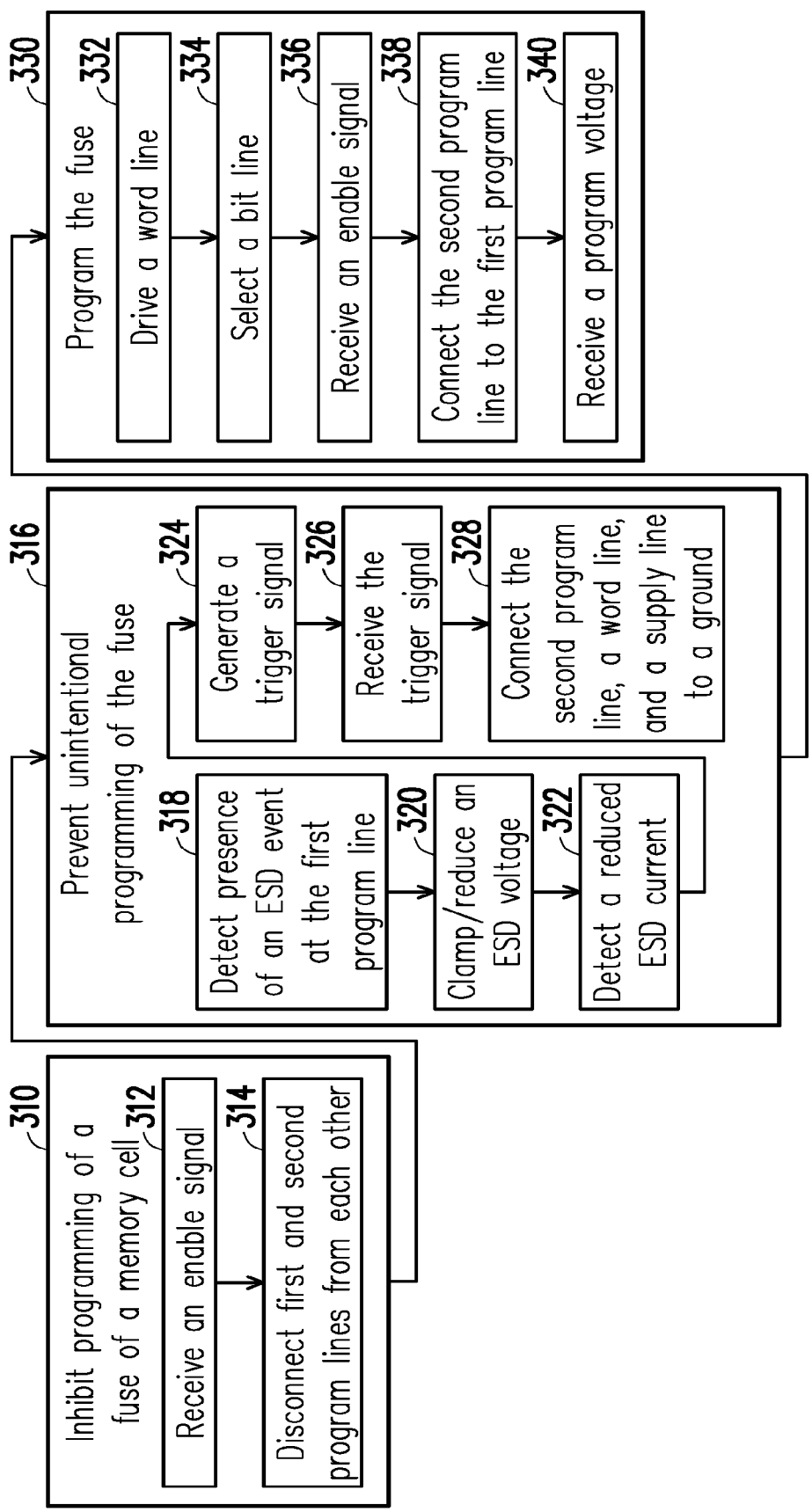
FIG. 3 is a flow chart illustrating an exemplary method of operation of a memory device in accordance with some embodiments.

FIG. 3 is a flow chart illustrating an exemplary method 300 of operation of a memory device in accordance with some embodiments. The method 300 will be described with further reference to FIG. 2 for ease of understanding. It should be understood that the method 300 is applicable to structures other than that of FIG. 2. In operation 310, the program enabling circuit 230 is controlled to inhibit programming of the fuse (F). In this embodiment, operation 310 includes: a sub-operation 312 of the program enabling circuit 230 receiving an enable signal (EN), e.g., at a low level; and a sub-operation 314 of the program enabling circuit 230 disconnecting the second program line (PL2) from the first program line (PL1) in response to the enable signal (EN).

In operation 316, the fuse protection circuit 130 prevents unintentional programming of the fuse (F). In this embodiment, operation 316 includes: a suboperation 318 of the clamping circuit 250 detecting presence of an ESD event at the first program line (PL1); a sub-operation 320 of the clamping circuit 250 clamping/reducing an ESD voltage associated with the ESD event to a reduced ESD voltage (Vesd); a sub-operation 322 of the detector 270 detecting a reduced ESD current (Iesd) associated with the reduced ESD voltage (Vesd); a sub-operation 324 of the detector 270 generating a trigger signal (TRG) at a level, e.g., high, indicative of the reduced ESD current (Iesd) being detected by the detector 270; a sub-operation 326 of the switches (SW1, SW2, SW3) receiving the trigger signal (TRG); and a sub-operation 328 of the switches (SW1, SW2, SW3) respectively connecting the second program line (PL2), the word line (WL), and the supply line (SL) to the ground in response to the trigger signal (TRG), discharging the reduced ESD current (Iesd).

In operation 330, the fuse (F) is programmed to store a bit, e.g., '1', in the memory cell 210. In this embodiment, operation 330 includes: a sub-operation 332 of the word line driver 220 driving, e.g., applying a high voltage level to, the word line (WL) to activate the access transistor (M2); a sub-operation 334 of the bit line selector 240 selecting, e.g., applying a low voltage level to, the bit line (BL) to activate the pass gate transistor (M1); a sub-operation 336 of the program enabling circuit 230 receiving an enable signal, e.g., at a high level; a sub-operation 338 of the program enabling circuit 230 connecting the second program line (PL2) to the first program line (PL1) in response to the enable signal (EN); and a sub-operation 348 of the first program line (PL1) receiving a program voltage (Vprogram), resulting in a program current (Iprogram) that is associated with the program voltage (Vprogram) and that flows through, blowing/programming, the fuse (F).

Figure 4:
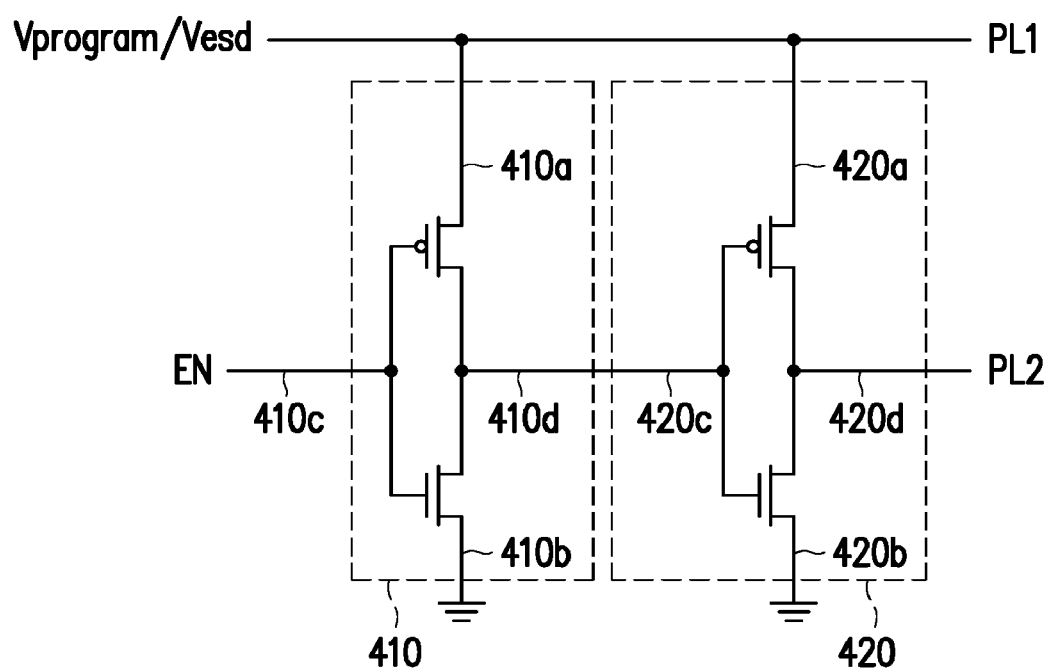
FIG. 4 is a schematic diagram illustrating an exemplary program enabling circuit in accordance with some embodiments.

FIG. 4 is a schematic diagram illustrating an exemplary program enabling circuit 230 in accordance with some embodiments. The example program enabling circuit 230 includes first and second inverters 410, 420, each of which includes a first inverter terminal 410a, 420a, a second inverter terminal 410b, 420b, an input terminal 410c, 420c, and an output terminal 410d, 420d.

The first inverter terminals 410a, 420b serve as the first input terminal 230a of the program enabling circuit 230 and are thus connected to the first program line (PL1). The second inverter terminals 410b, 420b are connected to the ground. The input terminal 410c serves as the second input terminal 230b of the program enabling circuit 230 and is thus configured to receive the enable signal (EN). The input terminal 420c is connected to the output terminal 410d. The output terminal 420d serves as the output terminal 230c of the program enabling circuit 230 and is thus connected to the second program line (PL2).

In operation, when the enable signal (EN) is at a low level, e.g., when it is desired to inhibit programming of the fuse (N), the first and second inverters 410, 420 disconnect the second program line (PL2) from the first program line (PL1) and connect the second program line (PL2) to the ground. On the other hand, when the enable signal is at a high level, e.g., when it is desired to program the fuse (N), the first and second inverters 410, 420 connect the second program line (PL2) to the first program line (PL1).

Figure 5:
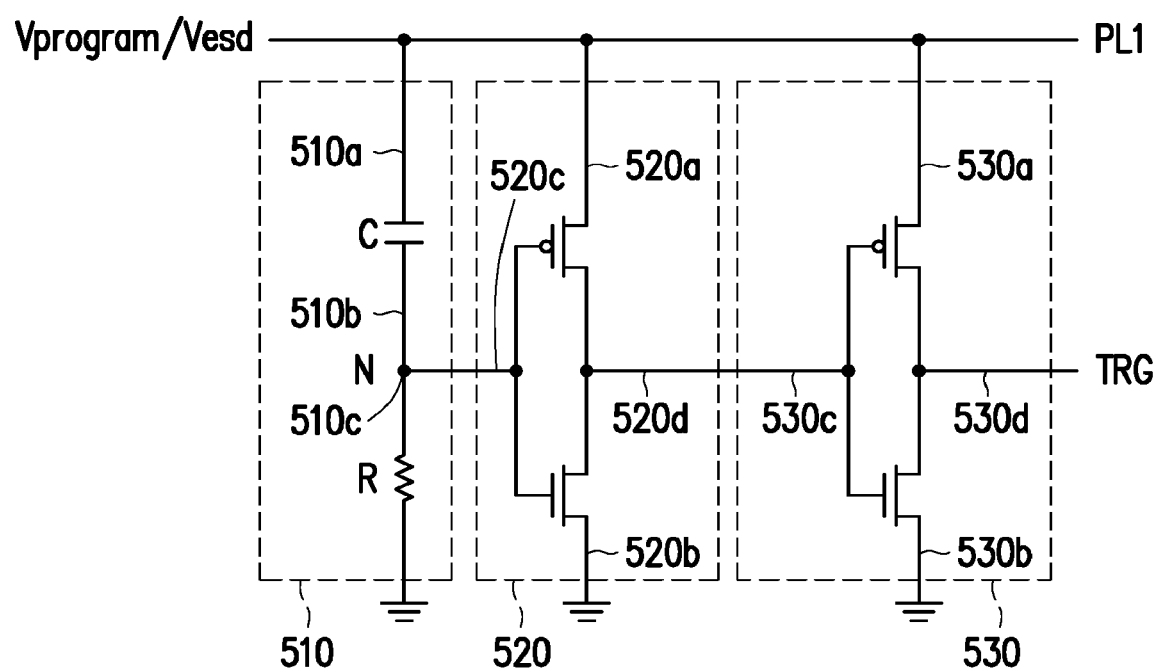
FIG. 5 is a schematic diagram illustrating an exemplary detector in accordance with some embodiments.

FIG. 5 is a schematic diagram illustrating an exemplary detector 270 in accordance with some embodiments. The detector 270 includes a time delay circuit 510 and first and second inverters 520, 530. In this embodiment, the time delay circuit 510 is in the form of an RC circuit and includes a resistor (R) and a capacitor (C). It should be understood that, after reading this disclosure, the time delay circuit 510 can be in any form of time delay circuit, e.g., an RL or RLC circuit, so long as it achieves the intended purpose described herein. The resistor (R) is connected between a node 510c and the ground. The capacitor (C) has a first capacitor terminal 510a connected to the first program line (PL1) and a second capacitor terminal 510b connected to the node 510c. The first inverter 520 has a first inverter terminal 520a connected to the first program line (PL1), a second inverter terminal 520b connected to the ground, and an input terminal 520c connected to the node 510c. The second inverter 520 has a first inverter terminal 520a connected to the first program line (PL1), a second inverter terminal 530b connected to the ground, an input terminal 530c connected to an output terminal 520d of the first inverter 520, and an output terminal 530d that serves as the output terminal 270b of the detector 270 and that is thus configured to provide the trigger signal (TRG). The terminals 510a, 520a, 530a serve as the input terminal 270a of the detector 270.

In operation, when the time delay circuit 510 receives a low-level node signal (N), the first and second inverters 520, 530 connect the output terminal 530d to the ground. As a result, a low-level trigger signal (TRG) is provided at the output terminal 530d, indicating absence of an ESD event. When the first program line (PL1) receives a program voltage (Vprogram), the time delay circuit 510 maintains the node signal (N) at the low level. On the other hand, when an ESD event occurs at the first program line (PL1), the time delay circuit 510 is unable to maintain the node signal (N) at the low level. This causes the node signal (N) to transition to a high level. This, in turn, enables the first and second inverters 520, 530 to connect the output terminal 530d to the first program line (PL1). As a result, the trigger signal (TRG) transitions to a high level.

Figure 6:
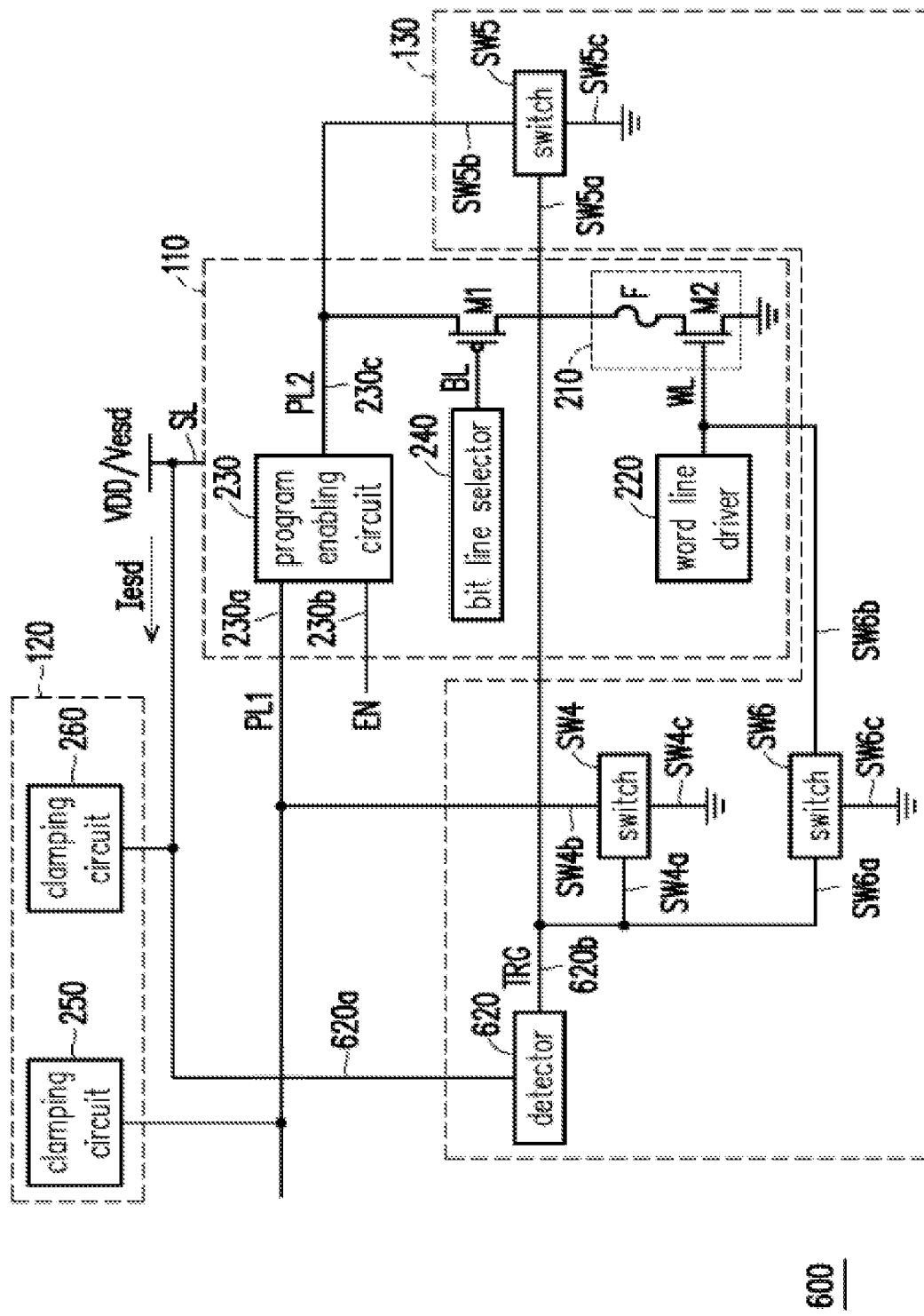
FIG. 6 is a schematic diagram illustrating the second exemplary memory device in accordance with some embodiments.

FIG. 6 is a schematic diagram illustrating the second exemplary memory device 600 in accordance with some embodiments. This embodiment differs from the previous embodiment in that the fuse protection circuit 130 of the memory device 600 includes a detector 620 and switches (SW4, SW5, SW6). The detector 620 is configured to detect a reduced ESD current (Iesd) that flows through the supply line (SL). The switches (SW4, SW5, SW6) are controlled by the detector 620 to respectively connect the first program line (PL1), the second program line (PL2), and the word line (WL) to the ground upon detection by the detector 620 of the reduced ESD current (Iesd). In further detail, the detector 620 has an input terminal 620a connected to the supply line (SL). The switch (SW4) has a first switch terminal (SW4a) connected to an output terminal 620b of the detector 620, a second switch terminal (SW4b) connected to the first program line (PL1), and a third switch terminal (SW4c) connected to the ground. The switch (SW5) has a first switch terminal (SW5a) connected to the output terminal 620b of the detector 620, a second switch terminal (SW5b) connected to the second program line (PL2), and a third switch terminal (SW5c) connected to the ground. The switch (SW6) has a first switch terminal (SW6a) connected to the output terminal 620b of the detector 620, a second switch terminal (SW6b) connected to the word line (WL), and a third switch terminal (SW6c) connected to the ground.

Figure 7:
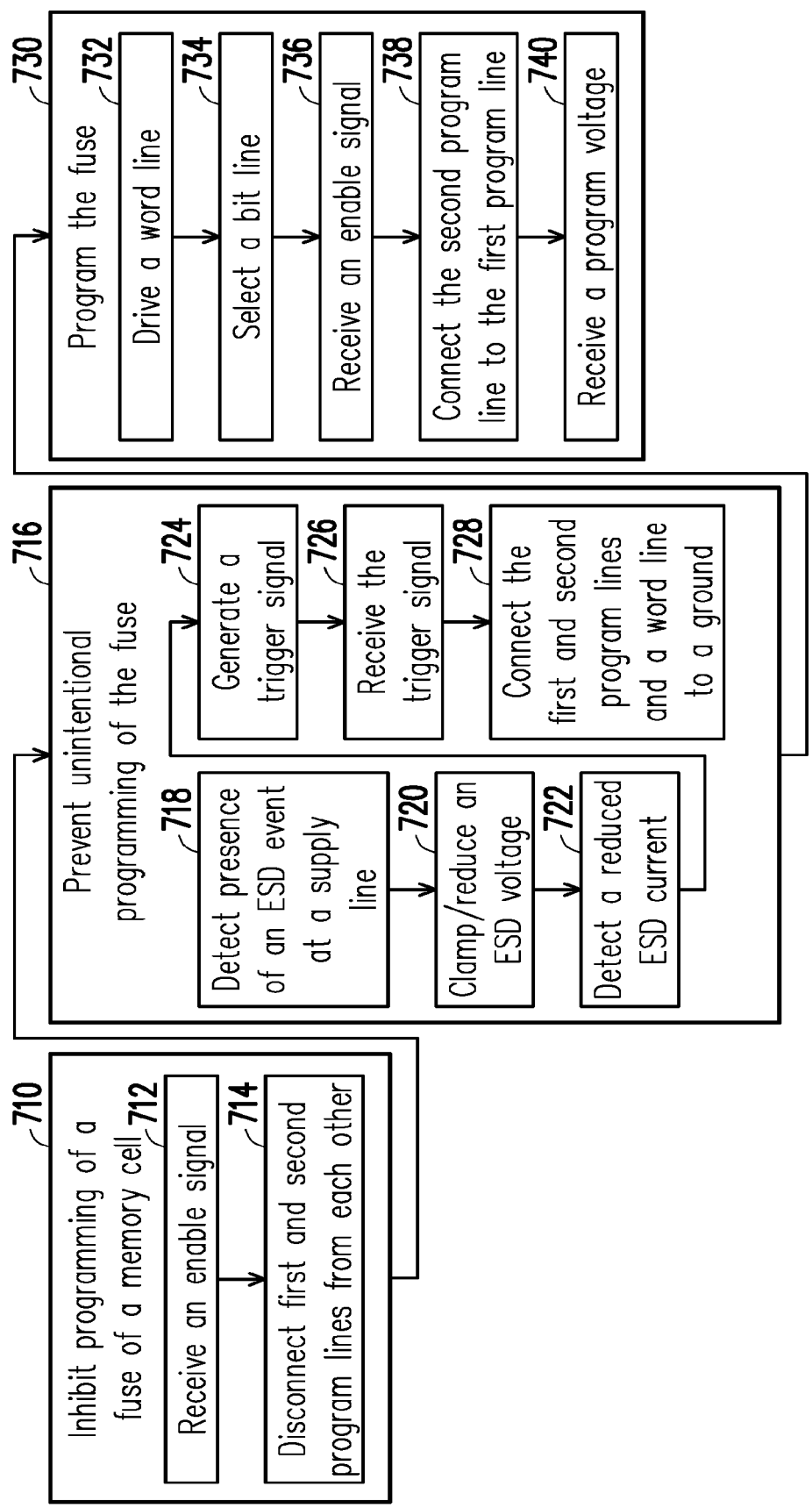
FIG. 7 is a flow chart illustrating an exemplary method of operation of a memory device in accordance with some embodiments.

FIG. 7 is a flow chart illustrating an exemplary method 700 of operation of a memory device in accordance with some embodiments. The method 700 will be described with further reference to FIG. 6 for ease of understanding. It should be understood that the method 700 is applicable to structures other than that of FIG. 6. In operation 710, the program enabling circuit 230 is controlled to inhibit programming of the fuse (F). In this embodiment, operation 710 includes: a sub-operation 712 of the program enabling circuit 230 receiving an enable signal (EN), e.g., at a low level; and a sub-operation 714 of the program enabling circuit 230 disconnecting the second program line (PL2) from the first program line (PL1) in response to the enable signal (EN).

In operation 716, the fuse protection circuit 130 prevents unintentional programming of the fuse (F). In this embodiment, operation 716 includes: a suboperation 718 of the clamping circuit 250 detecting presence of an ESD event at the supply line (SL); a sub-operation 720 of the clamping circuit 250 clamping/reducing an ESD voltage associated with the ESD event to a reduced ESD voltage (Vesd); a suboperation 722 of the detector 620 detecting a reduced ESD current (Iesd) associated with the reduced ESD voltage (Vesd); a sub-operation 724 of the detector 620 generating a trigger signal (TRG) at a level, e.g., high, indicative of the reduced ESD current (Iesd) being detected by the detector 620; a sub-operation 726 of the switches (SW4, SW5, SW6) receiving the trigger signal (TRG); and a sub-operation 728 of the switches (SW4, SW5, SW6) respectively connecting the second program line (PL2), the first program line (PL1), and the word line (WL) to the ground in response to the trigger signal (TRG), discharging the reduced ESD current (Iesd).

In operation 730, the fuse (F) is programmed to store a bit, e.g., '1', in the memory cell 210. In this embodiment, operation 730 includes: a sub-operation 732 of the word line driver 220 driving, e.g., applying a high voltage level to, the word line (WL) to activate the access transistor (M2); a sub-operation 734 of the bit line selector 240 selecting, e.g., applying a low voltage level to, the bit line (BL) to activate the pass gate transistor (M1); a sub-operation 736 of the program enabling circuit 230 receiving an enable signal (EN), e.g., at a high level; a sub-operation 738 of the program enabling circuit 230 connecting the second program line (PL2) to the first program line (PL1) in response to the enable signal (EN); and a sub-operation 740 of the first program line (PL1) receiving a program voltage (Vprogram), resulting in a program current (Iprogram) that is associated with the program voltage (Vprogram) and that flows through, blowing/programming, the fuse (F).

Figure 8:
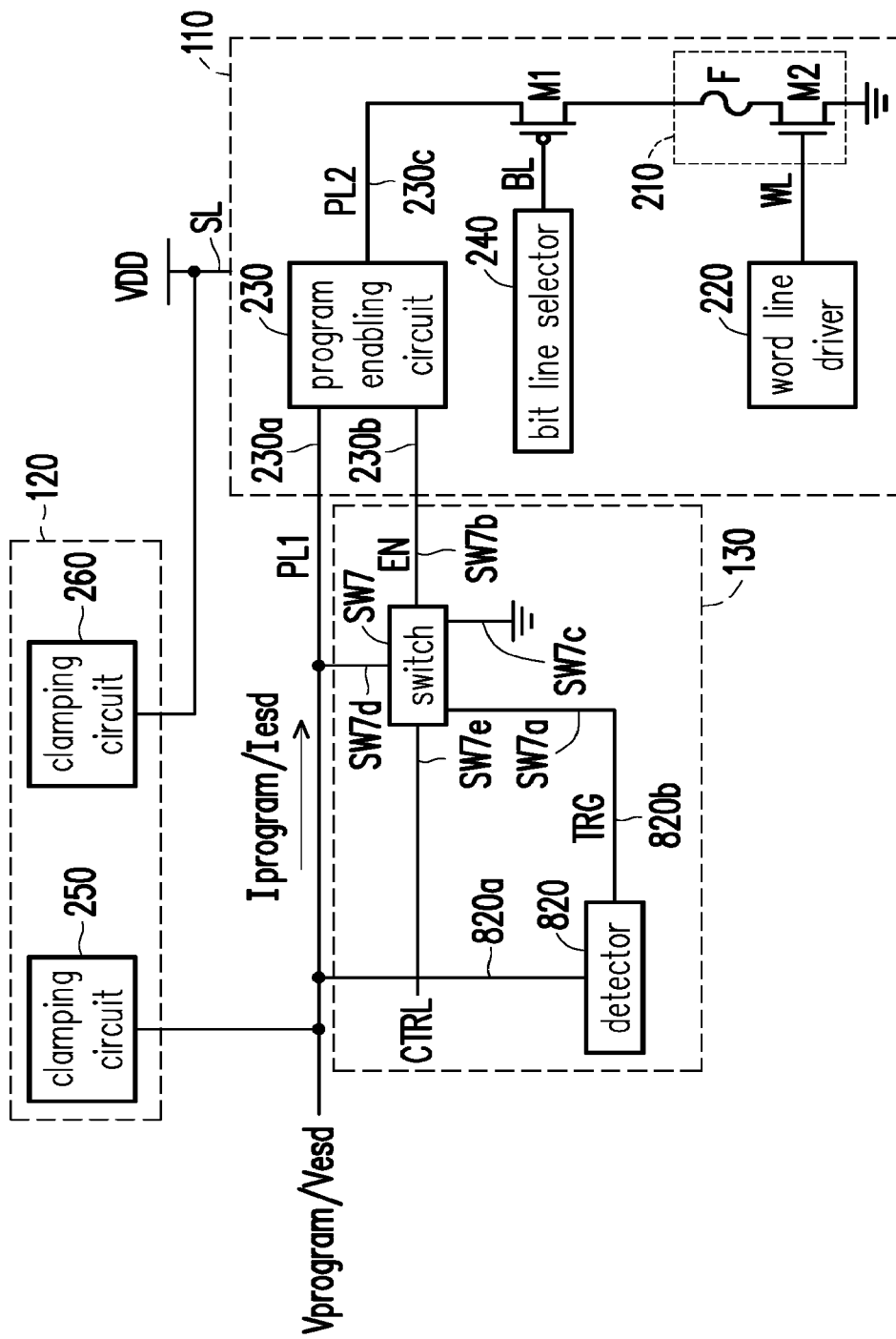
FIG. 8 is a schematic diagram illustrating the third exemplary memory device in accordance with some embodiments.

FIG. 8 is a schematic diagram illustrating the third exemplary memory device 800 in accordance with some embodiments. This embodiment differs from the memory device 100 in that the fuse protection circuit 130 of the memory device 800 includes a detector 820 and a switch (SW7). The detector 820 is configured to detect the reduced ESD current (Iesd). The switch (SW7) is controlled by the detector 820 to operate the program enabling circuit 230 to connect the second program line (PL2) to the ground upon detection by the detector 820 of the reduced ESD current (Iesd). The switch (SW7) is configured to operate the program enabling circuit 230 to inhibit/allow programming of the fuse (F). In further detail, the detector 820 has an input terminal 820a connected to the first program line (PL1). The switch (SW7) has a first switch terminal (SW7a) connected to an output terminal 820b of the detector 820, a second switch terminal (SW7b) connected to the second input terminal 230b of the program enabling circuit 230, a third switch terminal (SW7c) connected to the ground, a fourth switch terminal (SW7d) connected to the first program line (PL1), and a fifth switch terminal (SW7e) configured to receive a control signal (CTRL).

Figure 9:
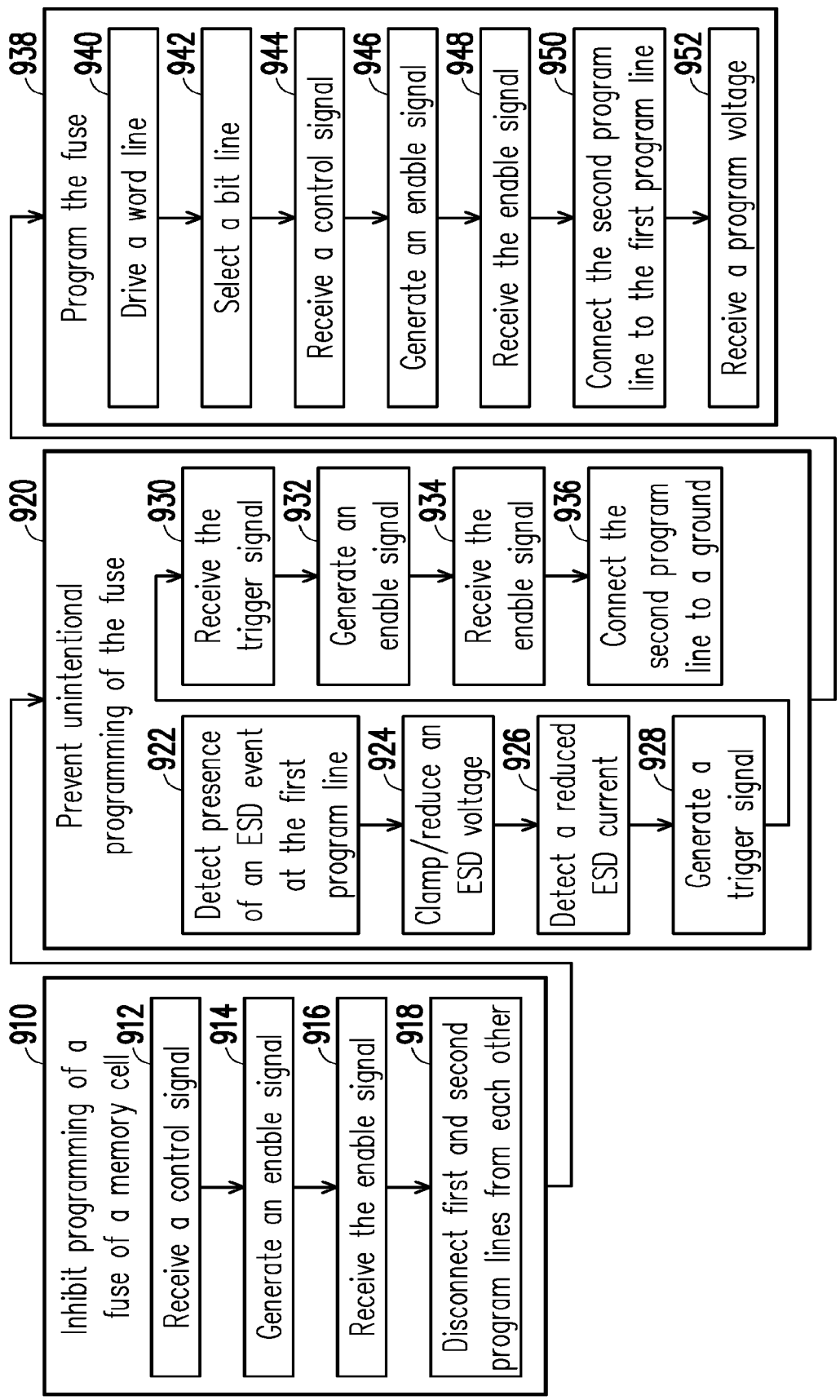
FIG. 9 is a flow chart illustrating an exemplary method of operation of a memory device in accordance with some embodiments.

FIG. 9 is a flow chart illustrating an exemplary method 900 of operation of a memory device in accordance with some embodiments. The method 900 will be described with further reference to FIG. 8 for ease of understanding. It should be understood that the method 900 is applicable to structures other than that of FIG. 8. In operation 910, the program enabling circuit 230 is controlled to inhibit programming of the fuse (F). In this embodiment, operation 910 includes: a sub-operation 912 of the switch (SW7) receiving a control signal (CTRL), e.g., at a high level; a sub-operation 914 of the switch (SW7) generating an enable signal (EN), e.g., at a low level, in response to the control signal (CTRL); a sub-operation 916 of the program enabling circuit 230 receiving the enable signal (EN); and a sub-operation 918 of the program enabling circuit 230 disconnecting the second program line (PL2) from the first program line (PL1) in response to the enable signal (EN).

In operation 920, the fuse protection circuit 130 prevents unintentional programming of the fuse (F). In this embodiment, operation 920 includes: a suboperation 922 of the clamping circuit 250 detecting presence of an ESD event at the first program line (PL1); a sub-operation 924 of the clamping circuit 250 clamping/reducing an ESD voltage associated with the ESD event to a reduced ESD voltage (Vesd); a sub-operation 926 of the detector 820 detecting a reduced ESD current (Iesd) associated with the reduced ESD voltage (Vesd); a sub-operation 928 of the detector 820 generating a trigger signal (TRG) at a level, e.g., high, indicative of the reduced ESD current (Iesd) being detected by the detector 820; a sub-operation 930 of the switch (SW7) receiving the trigger signal (TRG); a sub-operation 932 of the switch (SW7) generating an enable signal (EN), e.g., at a low level, in response to the trigger signal (TRG); a sub-operation 934 of the program enabling circuit 230 receiving the enable signal (EN); and a sub-operation 936 of the program enabling circuit 230 connecting the second program line (PL2) to the ground in response to the enable signal (EN), discharging the reduced ESD current (Iesd).

In operation 938, the fuse (F) is programmed to store a bit, e.g., '1', in the memory cell 210. In this embodiment, operation 938 includes: a sub-operation 940 of the word line driver 220 driving, e.g., applying a high voltage level to, the word line (WL) to activate the access transistor (M2); a sub-operation 942 of the bit line selector 240 selecting, e.g., applying a low voltage level to, the bit line (BL) to activate the pass gate transistor (M1); a sub-operation 944 of the switch (SW7) receiving a control signal (CTRL), e.g., at a low level; a sub-operation 946 of the switch (SW7) generating an enable signal, e.g., at a high level, in response to the control signal (CTRL); a suboperation 948 of the program enabling circuit 230 receiving the enable signal; a sub operation 950 of the program enabling circuit 230 connecting the second program line (PL2) to the first program line (PL1) in response to the enable signal (EN); and a suboperation 952 of the first program line (PL1) receiving a program voltage (Vprogram), resulting in a program current (Iprogram) that is associated with the program voltage (Vprogram) and that flows through, blowing/programming, the fuse (F).

Figure 10:
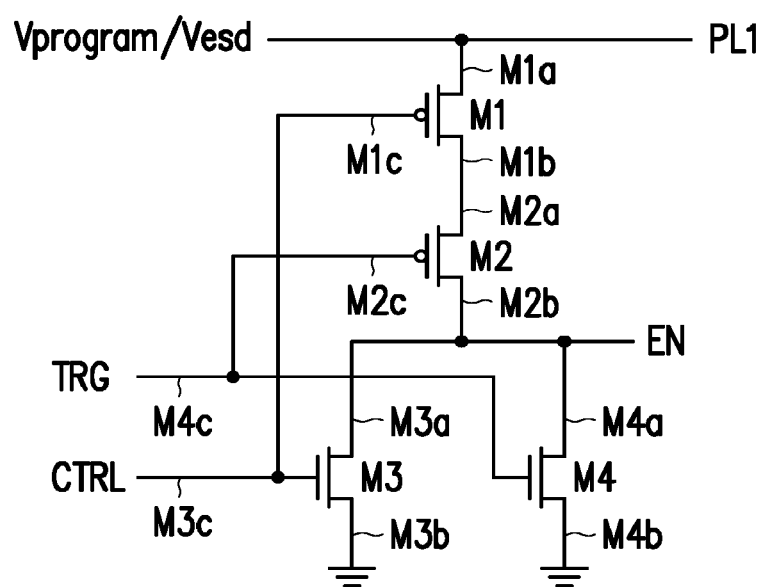
FIG. 10 is a schematic diagram illustrating an exemplary switch in accordance with some embodiments.

FIG. 10 is a schematic diagram illustrating an exemplary switch, e.g., switch (SW7) of FIG. 8, in accordance with some embodiments. The switch (SW7) includes ptype FETs (M1, M2) and n-type FETs (M3, M4). The FET (M1) has a first source/drain terminal (M1a) that serves as the fourth switch terminal (SW7d) of the switch (SW7) and that is thus connected to the first program line (PL1). The FET (M2) has a first source/drain terminal (M2a) connected to a second source/drain terminal (M1b) of the FET (M1). Each of the FETs (M3, M4) has a first source/drain terminal (M3a, M4a) that is connected to a second source/drain terminal (M2b) of the FET (M2) and a second source/drain terminal (M3b, M4b) that serves as the third switch terminal (SW7c) of the switch (SW7) and that is thus connected to the ground. The terminals (M2b, M3a, M4a) serve as second switch terminal (SW7b) of the switch (SW7) and are thus connected to the second input terminal 230b of the program enabling circuit 230 and configured to provide the enable signal (EN). Each of the FETs (M2, M4) further has a gate terminal (M2c, M4c) that serves as the first switch terminal (SW7a) of the switch (SW7) and that is thus connected to the output terminal 820b of the detector 820 and configured to receive the trigger signal (TRG). Each of the FETs (M1, M3) further has a gate terminal (M1c, M3c) that serves as the fifth switch terminal (SW7e) of the switch (SW7) and that is thus configured to receive the control signal (CTRL).

In operation, when the control signal (CTRL) is at a high level, e.g., when it is desired to inhibit programming of the fuse (N), the FET (M3) connects the terminals (M2b, M3a, M4a) to the ground. As a result, a low-level enable signal (EN) is provided as an output. At this time, when the trigger signal (TRG) transitions to a high level, e.g., when an ESD event occurs at the first program line (PL1), the FET (M4) connects the terminals (M2b, M3a, M4a) to the ground. As a result, the enable signal (EN) is maintained at the low level. On the other hand, when the control signal (CTRL) is at a low level, e.g., when it is desired to program the fuse (N), and when the trigger signal is at a low level, e.g., in the absence of an ESD event, FETs (M1, M2) connect the terminals (M2b, M3a, M4a) to the first program line (PL1). As a result, a high-level enable signal (EN) is provided as an output.

Figure 11:
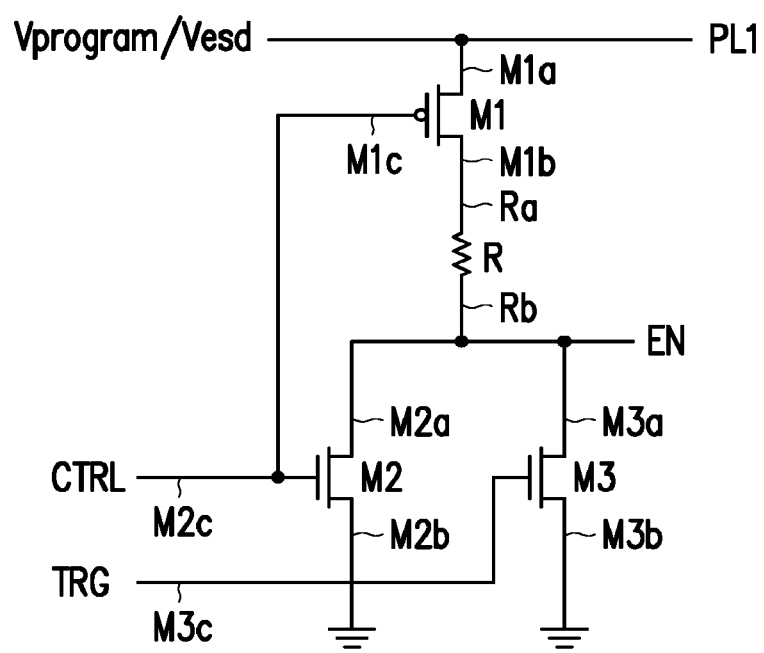
FIG. 11 is a schematic diagram illustrating an exemplary switch in accordance with some embodiments.

FIG. 11 is a schematic diagram illustrating exemplary switch, e.g., switch (SW7) of FIG. 6, in accordance with some embodiments. The switch (SW7) includes a p-type FET (M1), a resistor (R), and n-type FETs (M2, M3). The FET (M1) has a first source/drain terminal (M1a) that serves the fourth switch terminal (SW7d) of the switch (SW7) and that is thus connected to the first program line (PL1). The resistor (R) has a first resistor terminal (Ra) connected to a second source/drain terminal (M1b) of the FET (M1). Each of the FETs (M2, M3) has a first source/drain terminal (M2a, M3a) that is connected to a second resistor terminal (Rb) of the resistor (R) and a second source/drain terminal (M2b, M3b) that serves as the third switch terminal (SW7c) of the switch (SW7) and that is thus connected to the ground. The terminals (Rb, M2a, M3a) serve as the second switch terminal (SW7b) of the switch (SW7) and are thus connected to the second input terminal 230b of the program enabling circuit 230 and configured to provide the enable signal (EN). The FET (M3) further has a gate terminal (M3c) that serves as the first switch terminal (SW7a) of the switch (SW7) and that is thus connected to the output terminal 820b of the detector 820 and configured to receive the trigger signal (TRG). Each of the FETs (M1, M2) further has a gate terminal (M1c, M2c) that serves as the fifth switch terminal (SW7e) of the switch (SW7) and that is thus configured to receive the control signal (CTRL).

In operation, when the control signal (CTRL) is at a high level, e.g., when it is desired to inhibit programming of the fuse (N), the FET (M2) connects the terminals (Rb, M2a, M3a) to the ground. As a result, a low-level enable signal (EN) is provided as an output. At this time, when the trigger signal (TRG) transitions to a high level, e.g., when an ESD event occurs at the first program line (PL1), the FET (M3) connects the terminals (Rb, M2a, M3a) to the ground first program line (PL1). As a result, the enable signal (EN) is maintained at the low level. On the other hand, when the control signal (CTRL) is at a low level, e.g., when it is desired to program the fuse (N), and when the trigger signal is at a low level, e.g., in the absence of an ESD event, FET (M1) connects the terminals (Rb, M2a, M3a) to the first program line (PL1). As a result, a high-level enable signal (EN) is provided as an output.

Figure 12:
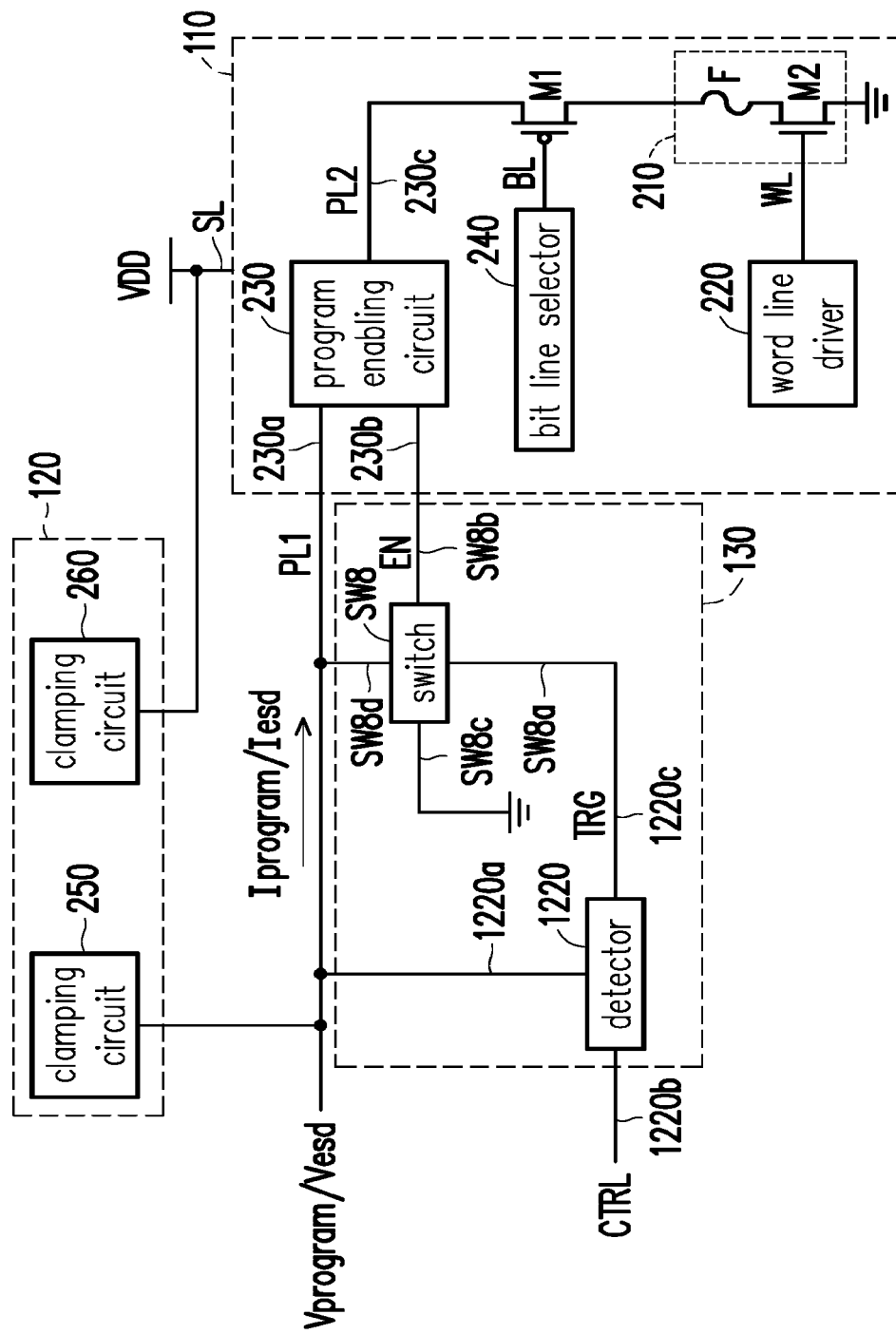
FIG. 12 is a schematic diagram illustrating the fourth exemplary memory device in accordance with some embodiments.

FIG. 12 is a schematic diagram illustrating the fourth exemplary memory device 1200 in accordance with some embodiments. This embodiment differs from the memory device 100 in that the fuse protection circuit 130 of the memory device 1200 includes a detector 1200 and a switch (SW8). The detector 1200 is configured to detect the reduced ESD current (Iesd). The switch (SW8) is controlled by the detector 1200 to operate the program enabling circuit 230 to connect the second program line (PL2) to the ground upon detection by the detector 1200 of the reduced ESD current (Iesd). The switch (SW7) is further controlled by the detector 1200 to operate the program enabling circuit 230 to inhibit/allow programming of the fuse (F). In further detail, the detector 1200 has a first input terminal 1220a connected to the first program line (PL1) and a second input terminal 1220b configured to receive a control signal (CTRL). The switch (SW8) has a first switch terminal (SW8a) connected to an output terminal 1220c of the detector 1220, a second switch terminal (SW8b) connected to the second input terminal 230b of the program enabling circuit 230, a third switch terminal (SW8c) connected to the ground, and a fourth switch terminal (SW8d) connected to the first program line (PL1).

Figure 13:
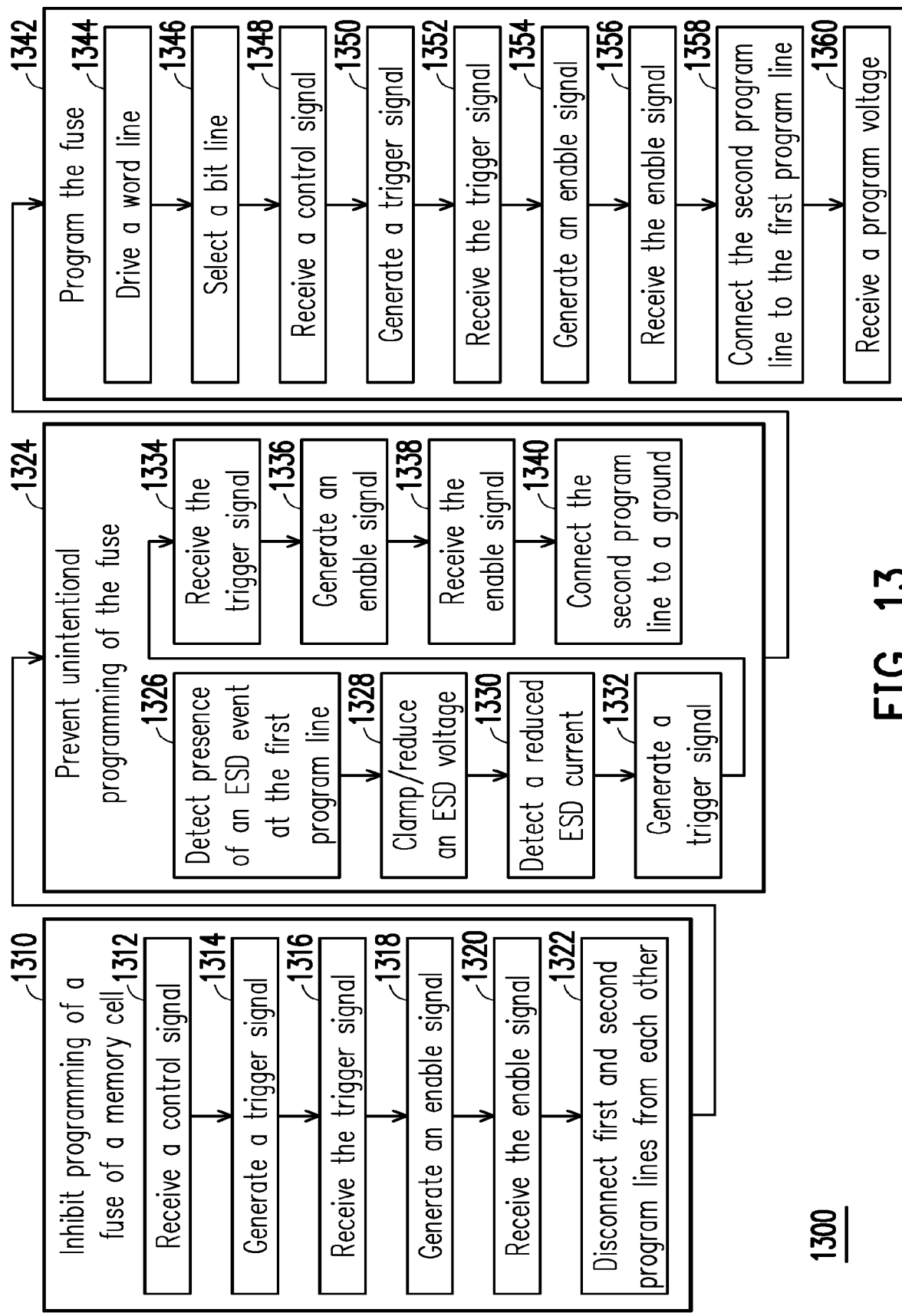
FIG. 13 is a flow chart illustrating an exemplary method of operation of a memory device in accordance with some embodiments

FIG. 13 is a flow chart illustrating an exemplary method 1300 of operation of a memory device in accordance with some embodiments. The method 1300 will be described with further reference to FIG. 12 for ease of understanding. It should be understood that the method 1300 is applicable to structures other than that of FIG. 12. In operation 1310, the program enabling circuit 230 is controlled to inhibit programmming of the fuse (F). In this embodiment, operation 1310 includes: a suboperation 1312 of the detector 1220 receiving a control signal (CTRL), e.g., at a high level; a sub-operation 1314 of the detector 1220 generating a trigger signal (TRG), e.g., at a high level, in response to the control signal (CTRL); a sub-operation 1316 of the switch (SW8) receiving the trigger signal (TRG); a sub-operation 1318 of the switch (SW8) generating an enable signal (EN), e.g., at a low level, in response to the trigger signal (TRG); a sub-operation 1330 of the program enabling circuit 230 receiving the enable signal (EN); and a sub-operation 1322 of the program enabling circuit 230 disconnecting the second program line (PL2) from the first program line (PL1) in response to the enable signal (EN).

In operation 1324, the fuse protection circuit 130 prevents unintentional programming of the fuse (F). In this embodiment, operation 1324 includes: a suboperation 1326 of the clamping circuit 250 detecting presence of an ESD event at the first program line (PL1); a sub-operation 1328 of the clamping circuit 250 clamping/reducing an ESD voltage associated with the ESD event to a reduced ESD voltage (Vesd); a sub-operation 1330 of the detector 1220 detecting the ESD current (Iesd) associated with the reduced ESD voltage (Vesd); a sub-operation 1332 of the detector 1220 generating a trigger signal (TRG) at a level, e.g., high, indicative of the reduced ESD current (Iesd) being detected by the detector 1220; a sub-operation 1334 of the switch (SW8) receiving the trigger signal (TRG); a sub-operation 1336 of the switch (SW8) generating an enable signal (EN), e.g., at a high level, in response to the trigger signal (TRG); a sub-operation 1338 of the program enabling circuit 230 receiving the enable signal (EN); and a sub-operation 1340 of the program enabling circuit 230 connecting the second program line (PL1) to the ground in response to the enable signal (EN), discharging the reduced ESD current (Iesd).

In operation 1342, the fuse (F) is programmed to store a bit, e.g., '1, in the memory cell 210. In this embodiment, operation 1342 includes: a sub-operation 1344 of the word line driver 220 driving, e.g., applying a high voltage level to, the word line (WL) to activate the access transistor (M2); a sub-operation 1346 of the bit line selector 240 selecting, e.g., applying a low voltage level to, the bit line (BL) to activate the pass gate transistor (M1); a sub-operation 1348 of the detector 1220 receiving a control signal (CTRL), e.g., at a low level; a sub-operation 1350 of the detector 1220 generating a trigger signal, e.g., at a low level, in response to the control signal (CTRL); a sub-operation 13 52 of the switch (SW8) receiving the trigger signal (TRG); a sub-operation 1354 of the switch (SW8) generating an enable signal (EN), e.g., at a high level, in response to the trigger signal (TRG); a sub-operation 1356 of the program enabling circuit 230 receiving the enable signal (EN); a sub-operation 1358 of the program enabling circuit 230 connecting the second program line (PL2) to the first program line (PL1) in response to the enable signal (EN); and a sub-operation 1360 of the first program line (PL1) receiving a program voltage (V program), resulting in a program current (Iprogram) that is associated with the program voltage (Vprogram) and that flows through, blowing/programming, the fuse (F).

Figure 14:
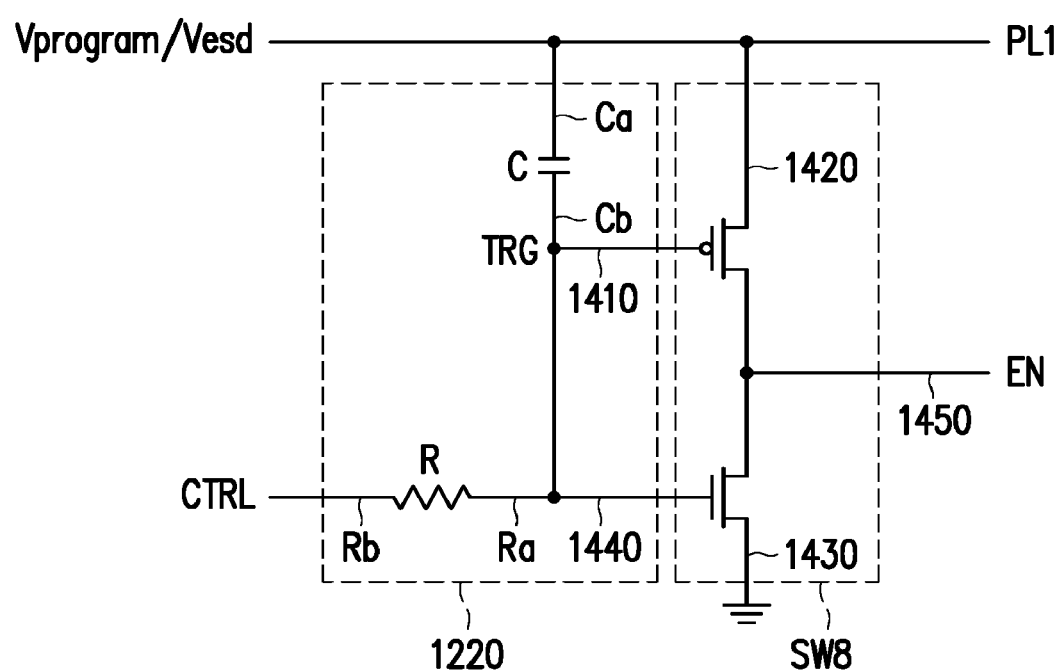
FIG. 14 is a schematic diagram illustrating an exemplary detector and an exemplary switch in accordance with some embodiments.

FIG. 14 is a schematic diagram illustrating an exemplary detector, e.g., detector 1220 of FIG. 12, and an exemplary switch, e.g., switch (SW8) of FIG. 12, in accordance with some embodiments. The detector 1220 is in the form of a time delay circuit and includes a capacitor (C) and a resistor (R). The capacitor (C) has a first capacitor terminal (Ca) that serves as the first input terminal 1220a of the detector 1220 and that is thus connected to the first program line (PL1) and a second capacitor terminal (Cb) that is connected to a node 1410. The node 1410 serves as the output terminal 1220c of the detector 1220 and is thus configured to provide the trigger signal (TRG). The resistor (R) has a first resistor terminal (Ra) that is connected to the node 1410 and a second resistor terminal (Rb) that serves as the second input terminal 1220b of the detector 1220 and that is thus configured to receive the control signal (CTRL).

The switch (SW8) is in the form of an inverter and has a first inverter terminal 1420 that serves as the fourth switch terminal (SW8d) of the switch (SW8) and that is thus connected to the first program line (PL1), a second inverter terminal 143 0 that serves as the third switch terminal (SW8c) of the switch (SW8) and that is thus connected to the ground, an input terminal 1440 that serves as the first switch terminal (SW8a) of the switch (SW8) and that is thus configured to receive the trigger signal (TRG), and an output terminal 1450 that serves as the second switch terminal (SW8b) of the switch (SW8) and that is thus configured to provide the enable signal (EN).

In operation, when the time delay circuit 1420 receives a high-level control signal (CTRL), e.g., when it is desired to inhibit programming of the fuse (N), the inverter (SW8) receives a high-level trigger signal (TRG) and connects the output terminal 1450 to the ground. As a result, a low-level enable signal (EN) is provided at the output terminal 1450. At this time, when an ESD event occurs at the first program line (PL1), the time delay circuit 1420 maintains the trigger signal (TRG) at the high level. On the other hand, when the time delay circuit 1420 receives a low-level control signal (CTRL), e.g., when it is desired to program the fuse (N), the inverter (SW8) receives a low-level trigger signal (TRG) and connects the output terminal 1450 to the first program line (PL1). As a result, a high-level enable signal (EN) is provided at the output terminal 1450. At this time, when a program voltage (Vprogram) is applied to the first program line (PL1), the time delay circuit 1420 maintains the trigger signal (TRG) at the low level.

Figure 15:
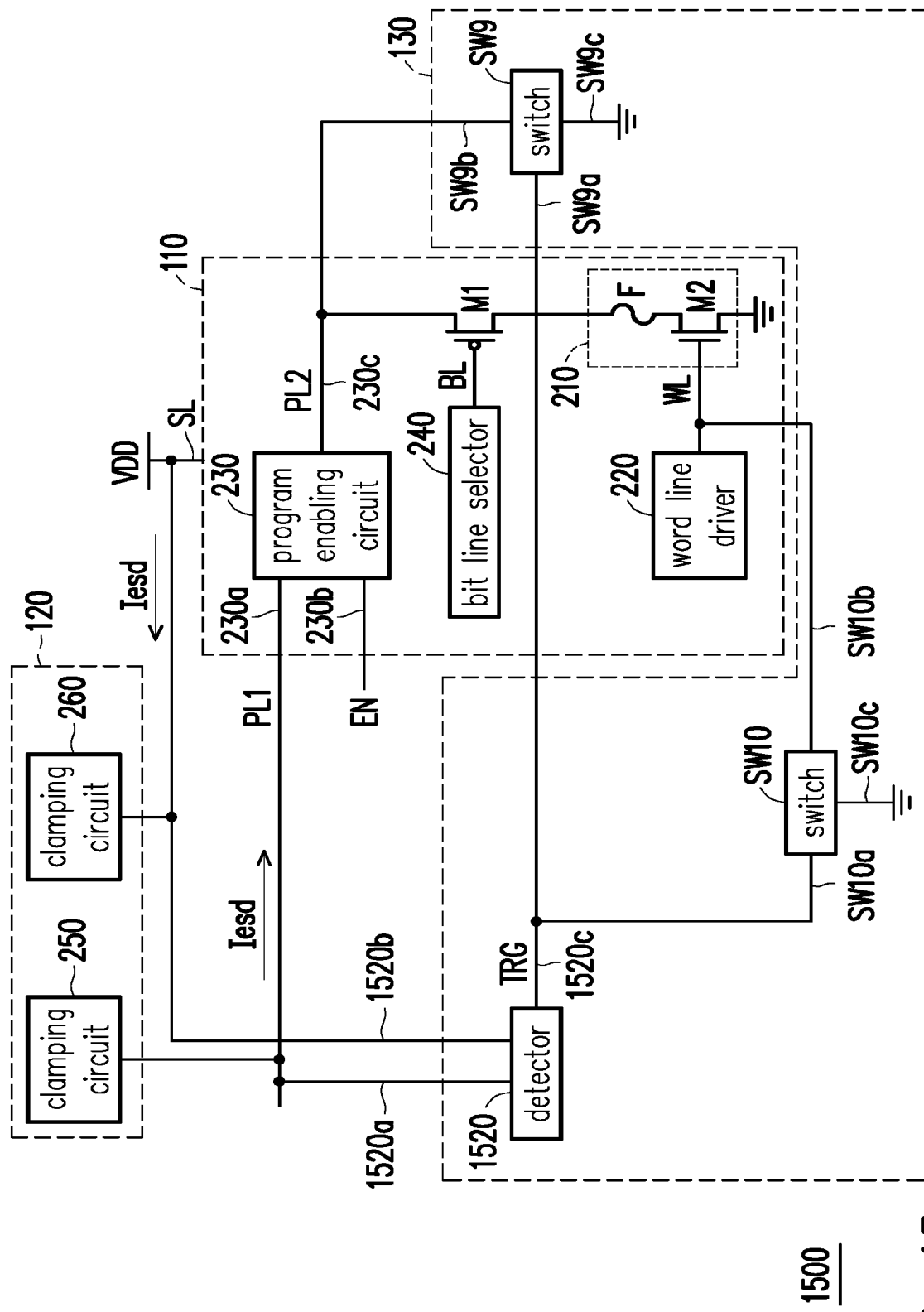
FIG. 15 is a schematic diagram illustrating the fifth exemplary memory device in accordance with some embodiments.

FIG. 15 is a schematic diagram illustrating the fifth exemplary memory device 1500 in accordance with some embodiments. This embodiment differs from the memory device 100 in that fuse protection circuit 130 of the memory device 1500 includes a detector 1520 and switches (SW9, SW10). The detector 1520 has a first input terminal 1520a connected to the first program line (PL1) and a second input terminal 1529b connected to the supply line (SL). The switch (SW9) has a first switch terminal (SW9a) connected to an output terminal 1520c of the detector 1520, a second switch terminal (SW9b) connected to the second program line (PL2), and a third switch terminal (SW9c) connected to the ground. The switch (SW10) has a first switch terminal (SW10a) connected to the output terminal 1520c of the detector 1520, a second switch terminal (SW10b) connected to the word line (WL), and a third switch terminal (SW10c) connected to the ground. In some embodiments, one of the switches (SW9, SW10) is an n-type FET. In other embodiments, one of the switches (SW9, SW10) is a p-type FET or any sort of transistor.

Figure 16:
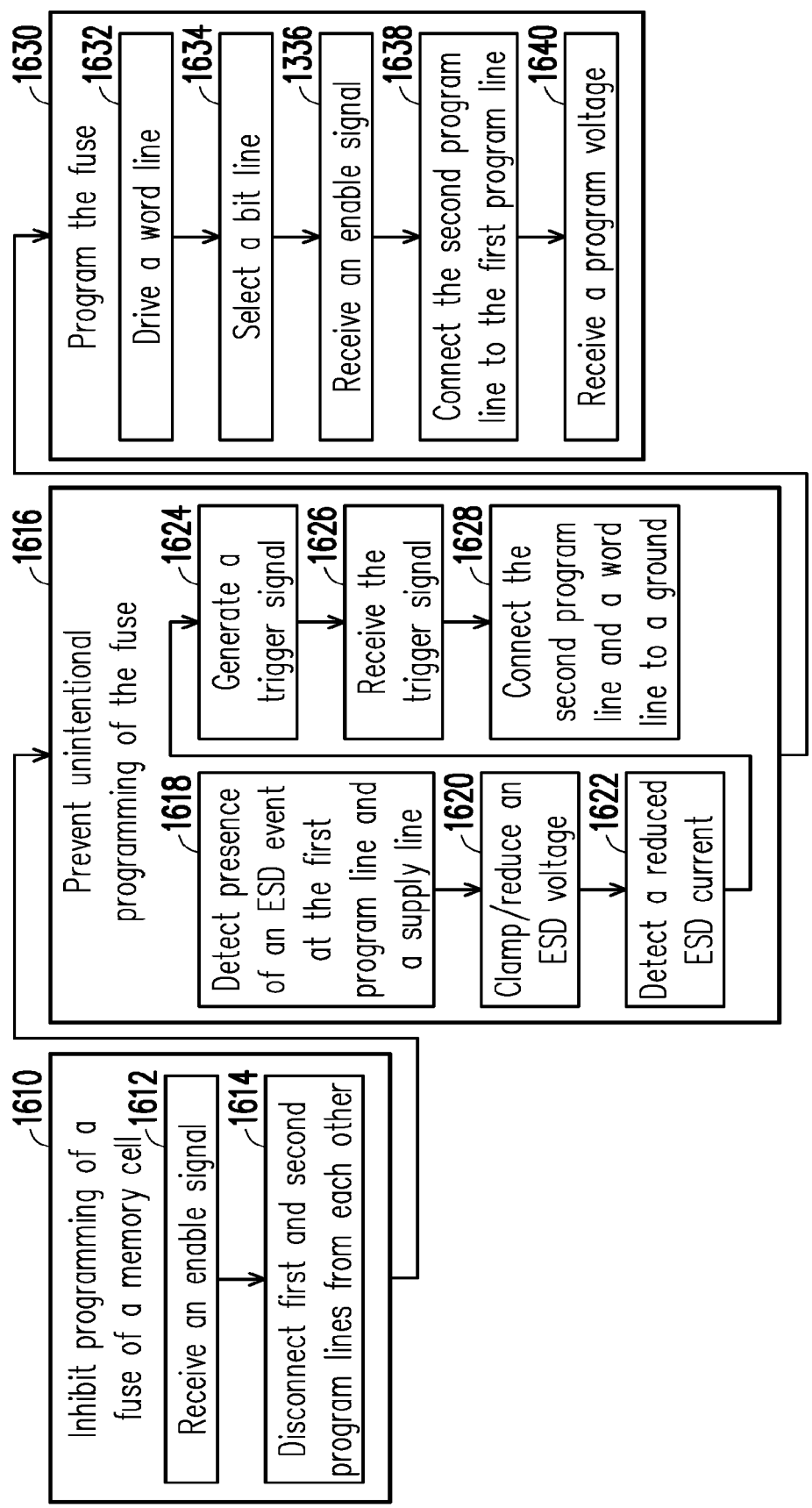
FIG. 16 is a flow chart illustrating an exemplary method of operation of a memory device in accordance with some embodiments

FIG. 16 is a flow chart illustrating an exemplary method 1600 of operation of a memory device in accordance with some embodiments. The method 300 will be described with further reference to FIG. 15 for ease of understanding. It should be understood that the method 1600 is applicable to structures other than that of FIG. 15. In operation 1610, the program enabling circuit 230 is controlled to inhibit programmmg of the fuse (F). In this embodiment, operation 1610 includes: a suboperation 1612 of the program enabling circuit 230 receiving an enable signal (EN), e.g., at a low level; and a sub-operation 1614 of the program enabling circuit 230 disconnecting the second program line (PL2) from the first program line (PL1) in response to the enable signal (EN).

In operation 1616, the fuse protection circuit 130 prevents unintentional programming of the fuse (F). In this embodiment, operation 1616 includes: a suboperation 1618 of the ESD protection circuit 120 detecting presence of an ESD event at the first program line (PL1) and the supply line (SL); a sub-operation 1620 of the ESD protection circuit 120 clamping/reducing an ESD voltage associated with the ESD event and at the first program line (PL 1) and/or the supply line (SL) to a reduced ESD voltage (Vesd); a sub-operation 1622 of the detector 1520 detecting a reduced ESD current (Iesd) associated with the reduced ESD voltage (Vesd); a sub-operation 1624 of the detector 1520 generating a trigger signal (TRG) at a level, e.g., high, indicative of the reduced ESD current (Iesd) being detected by the detector 1520; a sub-operation 1626 of the switches (SW9, SW10) receiving the trigger signal (TRG); and a sub-operation 1628 of the switches (SW9, SW10) respectively connecting the second program line (PL2) and the word line (WL) to the ground in response to the trigger signal (TRG), discharging the ESD current (Iesd).

In operation 1630, the fuse (F) is programmed to store a bit, e.g., '1', in the memory cell 210. In this embodiment, operation 1630 includes: a sub-operation 1632 of the word line driver 220 driving, e.g., applying a high voltage level to, the word line (WL) to activate the access transistor (M2); a sub-operation 1634 of the bit line selector 240 selecting, e.g., applying a low voltage level to, the bit line (BL) to activate the pass gate transistor (M1); a sub-operation 1636 of the program enabling circuit 230 receiving an enable signal, e.g., at a high level; a sub-operation 1638 of the program enabling circuit 230 connecting the second program line (PL2) to the first program line (PL1) in response to the enable signal (EN); and a sub-operation 1640 of the first program line (PL1) receiving a program voltage (Vprogram), resulting in a program current (Iprogram) that is associated with the program voltage (Vprogram) and that flows through, blowing/programming, the fuse (F).

Figure 17:
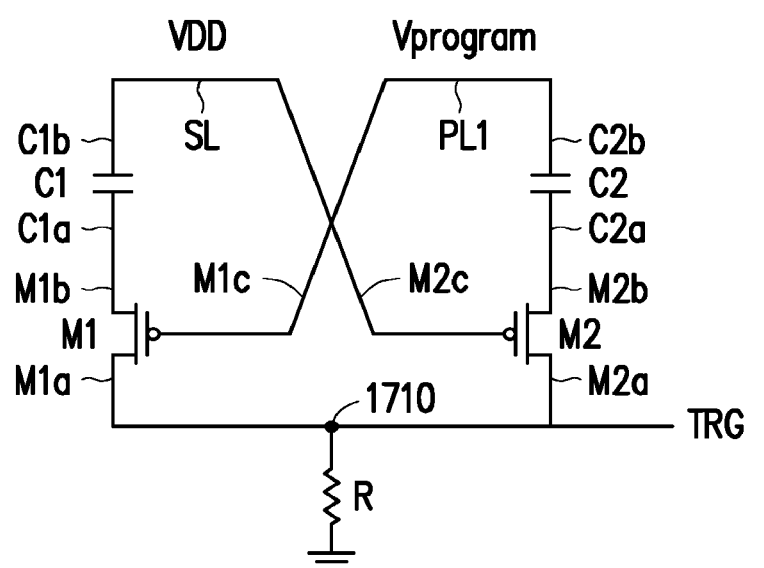
FIG. 17 is a schematic diagram illustrating an exemplary detector in accordance with some embodiments.

FIG. 17 is a schematic diagram illustrating an exemplary detector 1520 in accordance with some embodiments. The detector 1520 is in the form of a time delay circuit and includes capacitors (C1, C2), p-type FE Ts (M1, M2), and a resistor (R). The resistor (R) is connected between a node 1710 and the ground. The node 1710 serves as the output terminal 1120c of the detector 1120 and is thus configured to provide the trigger signal (TRG). Each of the FETs (M1, M2) has a first source/drain terminal (M1a, M2a) connected to the node 1710 and a gate terminal (M1c, M2c) connected to a respective one of the first program line (PL1) and the supply line (SL). Each of the capacitors (C1, C2) has a first capacitor terminal (C1a, C2a) connected to a second source/drain terminal (M1b, M2b) of a respective one of the FETs (M1, M2) and a second capacitor terminal (C1b, C2b) connected to a respective one of the supply line (SL) and the first program line (PL1). The terminals (M1c, C2b) serve as the first input terminal 1520a of the detector 1520. The terminals (M2c, C1b) serve as the second input terminal 1520b of the detector 1520.

In operation, the FET (M2) first connects the capacitor (C2) to the resistor (R). As a result, a low-level trigger signal (TRG) appears at the node 1720. Then, when the first program line (PL1) receives a program voltage (Vprogram), the time delay circuit 1520 maintains the trigger signal (TRG) at the low level. On the other hand, when an ESD event occurs at the first program line (PL1), the time delay circuit 1520 is unable to maintain the trigger signal (TRG) at the low level. As a result, the trigger signal (TRG) transitions to a high level.

Similarly, the FET (M1) first connects the capacitor (C1) to the resistor (R). As a result, a low-level trigger signal (TRG) appears at the node 1710. Then, when the supply line (SL) receives a supply voltage (VDD), the time delay circuit 1520 maintains the trigger signal (TRG) at the low level. On the other hand, when an ESD event occurs at the supply line (SL), the time delay circuit 1520 is unable to maintain the trigger signal (TRG) at the low level. As a result, the trigger signal (TRG) transitions to a high level.

In one embodiment, a memory device comprises a memory circuit and a fuse protection circuit. The memory circuit includes a supply line, a program line, and a memory cell. The supply line is configured to receive a supply voltage. The memory cell includes a fuse. The program line is configured to receive a program voltage for programming the fuse. The fuse protection circuit is coupled to the memory circuit, is configured to prevent unintentional programming of the fuse, and includes a detector and a switch. The detector is configured to detect an electro-static discharge (ESD) current that flows through one of the supply line and the program line. The switch is configured to couple the other of the supply line and the program line to a ground when the detector detects the ESD current.

In another embodiment, a memory device comprises a memory circuit and a fuse protection circuit. The memory circuit includes a supply line, a memory cell, and a word line. The supply line is configured to receive a supply voltage. The memory cell includes a fuse. The program line is configured to receive a program voltage for programming the fuse. The word line is coupled to the memory cell. The fuse protection circuit 1s coupled to the memory circuit, 1s configured to prevent unintentional programming of the fuse, and includes a detector and a switch. The detector is configured to detect an electro-static discharge (ESD) current that flows through one of the supply line and the program line. The switch is configured to couple the word line to a ground when the detector detects the ESD current.

In another embodiment, a method for preventing unintentional programming of a fuse of a memory cell of a memory device is provided. The memory device includes a first program line and a second program line coupled to the memory cell and selectively coupled to the first program line. The method comprises: detecting an electro-static discharge (ESD) current flowing through one of the first program line and a supply line; and generating a trigger signal based on detection of the ESD current that causes decoupling of the second program line from the first program line and coupling of the second program line to a ground, thereby discharging the ESD current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory circuit, including
      a supply line configured to receive a supply voltage,
      a fuse, and
      a program line configured to receive a program voltage for programming the fuse; and
   a fuse protection circuit configured to couple one of the supply line and the program line to a ground when an electro-static discharge (ESD) current flows through the other of the supply line and the program line.

2. The memory device of claim 1, further comprising an ESD protection circuit coupled to the memory circuit and configured to reduce an ESD voltage to a reduced ESD voltage, wherein the ESD current is associated with the reduced ESD voltage.

3. The memory device of claim 1, further comprising a second program line selectively coupled to the program line, wherein the fuse protection circuit is configured to couple the second program line to the ground in the presence of the ESD current on one of the supply line and the program line.

4. The memory device of claim 1, further comprising a word line, wherein the fuse protection circuit is configured to couple the word line to the ground when a detector detects the ESD current.

5. The memory device of claim 1, further comprising:
   a second program line; and
   a program enabling circuit coupled between the program line and the second program line and configured to receive an enable signal and to selectively couple and decouple the second program line to and from the program line in response to the enable signal.

6. The memory device of claim 5, wherein the program enabling circuit is further configured to selectively couple and decouple the second program line to and from the ground in response to the enable signal.

7. A memory device comprising:
   a memory circuit including
      a supply line configured to receive a supply voltage,
      a fuse, and
      a program line configured to receive a program voltage for programming the fuse, and
      a word line; and
   a fuse protection circuit configured to couple the word line to a ground when an electrostatic discharge (ESD) current flows through one of the supply line and the program line.

8. The memory device of claim 7, further comprising a second program line selectively coupled to the program line, wherein the fuse protection circuit is configured to couple the second program line to the ground in the presence of the ESD current on one of the supply line and the program line.

9. The memory device of claim 7, further comprising a switch coupled to the program line and configured to couple the program line to the ground in the presence of the ESD current on one of the supply line and the program line.

10. The memory device of claim 7, further comprising a switch coupled to the supply line and configured to couple the supply line to the ground in the presence of the ESD current on one of the supply line and the program line.

11. The memory device of claim 7, further comprising
   a second program line; and
   a program enabling circuit coupled between the program line and the second program line and configured to receive an enable signal and to selectively couple and decouple the second program line to and from the program line in response to the enable signal.

12. The memory device of claim 11, wherein the program enabling circuit is further configured to selectively couple and decouple the second program line to and from the ground in response to the enable signal.

13. A method for preventing unintentional programming of a fuse of a memory device, the memory device including a supply line and a program line, the method comprising:
   detecting an electro-static discharge (ESD) current flowing through one of the supply line and the program line; and
   grounding the other of the of the supply line and the program line.

14. The method of claim 13, further comprising:
   detecting the presence of an ESD event at one of the program line and the supply line; and
   reducing an ESD voltage associated with the ESD event to a reduced ESD voltage, the ESD current being associated with the reduced ESD voltage.

15. The method of claim 13, further comprising, in response to a trigger signal, coupling the second program line to the ground.

16. The method of claim 13, further comprising:
   in response to a trigger signal, generating an enable signal; and
   in response to the enable signal, coupling the program line to the ground.

17. The method of claim 13, further comprising, in response to a trigger signal, coupling a word line to the ground.

18. The method of claim 13, further comprising, in response to a trigger signal, coupling the program line to the ground.

19. The method of claim 13, further comprising, in response to a trigger signal, coupling the supply line to the ground.

20. The method of claim 13, further comprising:
   receiving a control signal; and
   in response to the control signal, generating a trigger signal for causing coupling of the program line to the second program line.

* * * * *